(12) United States Patent
Werner et al.

(10) Patent No.: US 6,724,096 B2
(45) Date of Patent: Apr. 20, 2004

(54) DIE CORNER ALIGNMENT STRUCTURE

(75) Inventors: Thomas Werner, Dresden (DE); Gunter Grasshoff, Dresden (DE); Bernd Schulz, Radebeul (DE); Carsten Hartig, Meerane (DE)

(73) Assignee: Advanced Micro Devices, Inc., Austin, TX (US)

( * ) Notice: Subject to any disclaimer, the term of this patent is extended or adjusted under 35 U.S.C. 154(b) by 115 days.

(21) Appl. No.: 10/124,216

(22) Filed: Apr. 16, 2002

(65) Prior Publication Data

US 2002/0185753 A1 Dec. 12, 2002

(30) Foreign Application Priority Data

Jun. 12, 2001 (DE) .......................................... 101 28 269

(51) Int. Cl.[7] ........................ H01L 23/544; H01L 21/76; H01L 21/78
(52) U.S. Cl. ........................ 257/797; 438/401; 438/462; 438/975
(58) Field of Search .......................... 257/797; 438/401, 438/462, 975

(56) References Cited

U.S. PATENT DOCUMENTS

| 5,408,131 | A | 4/1995 | Khatri et al. ................ 257/797 |
| 5,753,391 | A | 5/1998 | Stone et al. .................. 430/22 |
| 6,002,182 | A | 12/1999 | Madurawe ................... 257/797 |
| 6,005,294 | A | 12/1999 | Tsuji et al. .................. 257/797 |

*Primary Examiner*—Eddie Lee
*Assistant Examiner*—Samuel A Gebremariam
(74) *Attorney, Agent, or Firm*—Williams, Morgan & Amerson, P.C.

(57) ABSTRACT

A semiconductor device structure comprises a corner structure enclosed by a delineation region, wherein the shape of the corner structure does not exhibit any symmetry with respect to point symmetry and axial symmetry, such that the corner structure is unambiguously recognizable by an automated alignment system. Furthermore, the inner region of the corner structure may be filled with a pattern indicating the type of material layer in which the corner structure is formed. The corner structure exhibits a strong contrast even if the wafer is subjected to a CMP treatment.

18 Claims, 1 Drawing Sheet

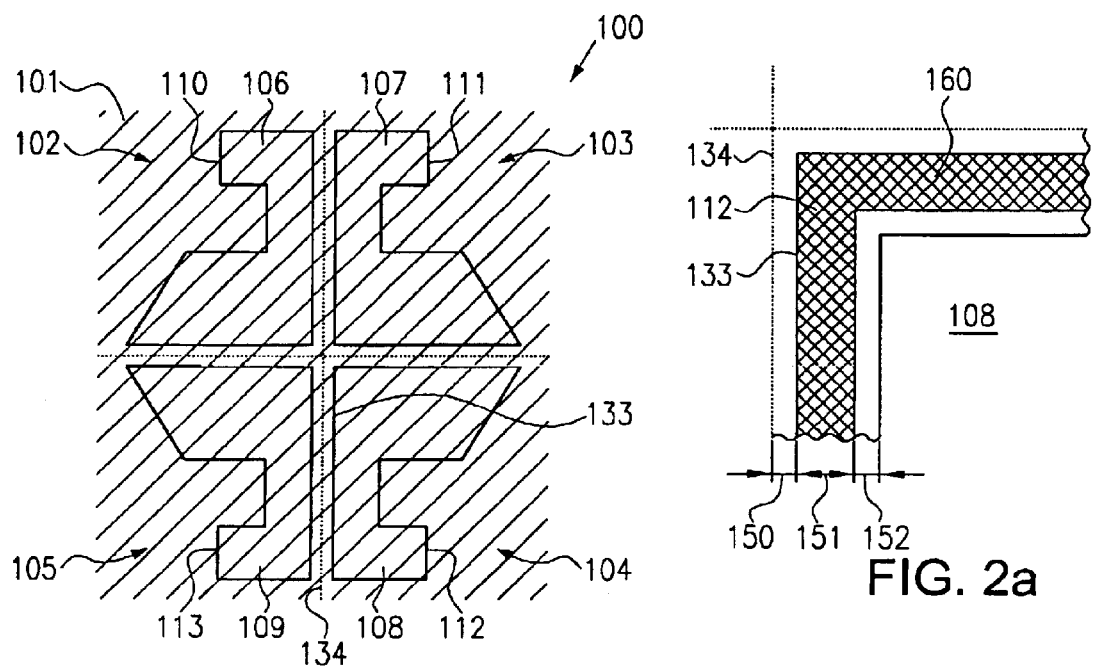
FIG. 1
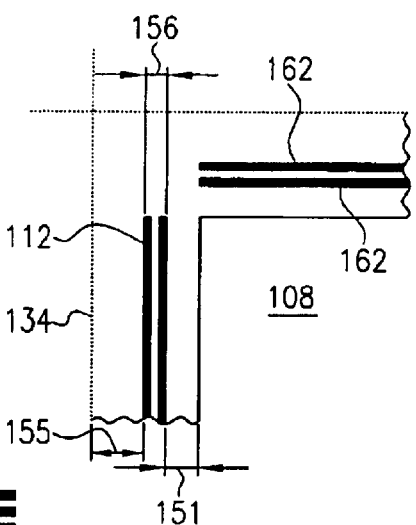
FIG. 2a
FIG. 2b
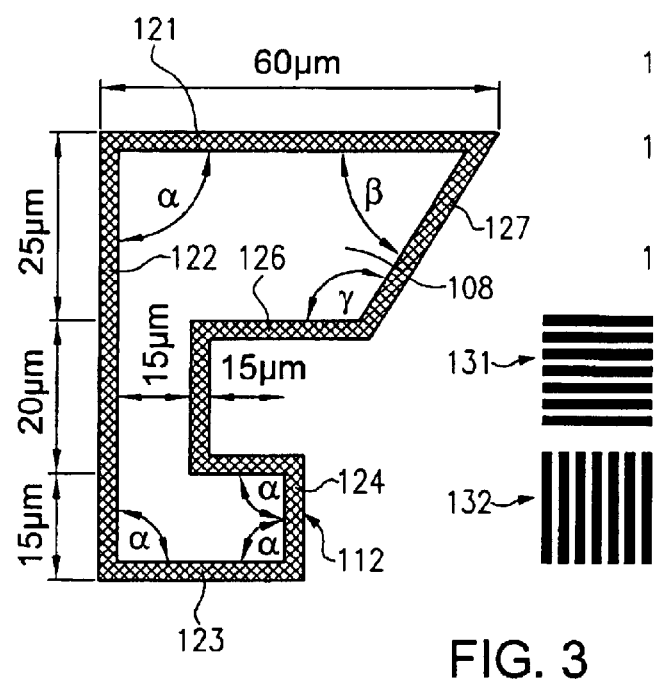
FIG. 3

DIE CORNER ALIGNMENT STRUCTURE

BACKGROUND OF THE INVENTION

1. Field of the Invention

The present invention relates to the field of semiconductor production, and, more particularly, to an alignment structure used in the photolithographical formation of semiconductor features and/or used for metrology/defect inspection tool alignment and measurement.

2. Description of the Related Art

The manufacturing process of integrated circuits involves the fabrication of numerous semiconductor elements on a single substrate, usually referred to as a wafer, by means of a lithographic process. In microlithography, features of the semiconductor elements, such as field effect transistors, are printed on a photoresist layer that is subsequently developed to produce a photoresist pattern. This pattern is then used as a mask for a further process, for example an etch process, to produce the required feature in the material layer underlying the patterned photoresist. Currently, in modern integrated circuits, semiconductor elements are patterned having a minimum feature size of about 0.18 micrometers. Thus, the lithographic apparatus and the equipment used for transferring an image from a mask to the wafer and for patterning corresponding features must exhibit the capability of reliably and reproducibly generating feature sizes with tolerances that are defined by very strict design rules.

In addition to quality of the lithographic imagery and the processes involved in patterning circuit features, the accuracy with which an image can be positioned on the surface of the wafer is of comparable importance since a plurality of photolithographical steps have to be performed, i.e., a sequence of masking layers is required to obtain the final integrated circuit. The features patterned on successive layers must bear a spatial relationship to one another to ensure the functionality of the final device. Accordingly, each level must be precisely aligned to one or more of the previous levels. Due to unavoidable inaccuracies in the processes for transferring and patterning features, a minimum registration tolerance must be allowed between the edges of a feature of a given level with respect to a preceding level. This minimum tolerance is one of the aforementioned design rules used in laying out the circuit patterns for a specified integrated circuit. Thus, numerous metrology processes are carried out to effectively monitor the various manufacturing stages of the semiconductor device with respect to the individual process steps necessary to transfer and pattern circuit features.

The metrology systems employed for monitoring the various stages of the semiconductor device have to reliably produce accurate measurement results, thereby yielding a high throughput due to economical constraints. In most metrology systems, the wafer must be precisely aligned with respect to the metrology apparatus to obtain the required information. For instance, a defect inspection tool may be used to identify the number, the size and the accurate position of any defects generated by the manufacturing process of interest. Furthermore, many of the metrology systems are automated or semi-automated to achieve improved throughput and accuracy. For example, an automated overlay measurement system may handle 50–60 wafers per hour, thereby providing high measurement accuracy, whereas only 10–15 wafers may be manually measured per hour. Due to the automated measurement process, however, the wafers to be inspected have to be appropriately aligned in the measurement apparatus by means of a corresponding alignment mark on the wafer. Usually, step-and-repeat and step-and-scan lithography systems are used in modem integrated circuit fabrication such that a large number of exposure fields, each of which may represent the area of a final chip, are generated, while corresponding alignment marks are required in each exposure field to fully indicate each individual exposure field, in particular at a region where four exposure fields come into contact with each other.

Accordingly, a need exists for an effective alignment structure that may conveniently be used in automated metrology apparatus, such as in defect inspection tools, that clearly indicates the exposure field corner and cannot be confused with other structures in the exposure field.

SUMMARY OF THE INVENTION

In accordance with the present invention, a semiconductor device structure comprises a die region defined by an exposure field of a lithography apparatus used for fabricating the semiconductor device, wherein the die region comprises a material layer having a corner structure formed therein and located at a corner of the die region in spaced relationship to an edge of the die region. The semiconductor structure further comprises a delineation region that at least partially encloses the corner structure and that comprises a plurality of elongated patterns formed in the material layer, wherein the delineation region is asymmetric with respect to point symmetry and axial symmetry and also defines an inner region of the corner structure. Furthermore, the delineation region exhibits a plurality of angles of approximately 90° that are defined by at least some of the elongated patterns.

Due to the unique shape of the corner structure defined by the delineation region without any point and axial symmetry, the corner structure according to the present invention is unambiguously and easily detectable in any type of apparatus using optical alignment, such as measurement apparatus for metrology and defect inspection tools. Moreover, the inner region of the corner structure may be filled with any appropriate pattern that is in agreement with the design rules for the formation of the semiconductor device, thereby allowing the identification of specific process layers and the monitoring of process quality.

BRIEF DESCRIPTION OF THE DRAWINGS

The invention may be understood by reference to the following description taken in conjunction with the accompanying drawings, in which like reference numerals identify like elements, and in which:

FIG. 1 is a schematic top view of a portion of a semiconductor device structure wherein adjacent corner portions of four adjacent exposure fields are depicted;

FIGS. 2a and 2b are enlarged views of different delineation regions of the embodiments depicted in FIG. 1; and FIG. 3 shows a single corner structure having an inner region filled with a pattern of dense lines.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Moreover, various process steps as described below may be performed differently depending on particular design requirements. Furthermore, in this description only the relevant steps of the manufacture and the portions of the device necessary for understanding of the present invention are considered.

With reference to FIGS. 1 to 3, an exemplary embodiment of the present invention will now be described. In FIG. 1, a semiconductor device structure 100 comprises a material layer 101, such as a lightly doped silicon layer used as a zero layer for producing MOS field effect transistors. The semiconductor structure 100 further includes a plurality of exposure fields 102, 103, 104 and 105, of which only respective corner portions are depicted in FIG. 1. The exposure fields 102 to 105 may contain one or more chip areas that will include a complete circuitry for the finally completed integrated circuit.

The size of an individual exposure field depends on the type of integrated circuit to be formed and on the capability of the lithography apparatus used for transferring circuit features from a mask to the product wafer. For a typical step-and-repeat system, the size of the exposure field is about 22×22 mm. For an advanced step-and-scan system, the exposure field may cover an area of about 25×32 mm with a resolution of 0.25 $\mu$m.

The corner portions of the exposure fields 102 to 105, as depicted in FIG. 1, include corner structures 106, 107, 108 and 109 comprising respective delineation regions 110, 111, 112, and 113. The delineation regions 110, 111, 112 and 113 substantially define the outline of each of the corner structures 106 to 109. Furthermore, the delineation regions 110 to 113 define a distance to the respective edges of the corresponding exposure fields 101 to 105. For the sake of clarity, in FIG. 1 an inner region of each of the corner structures 106 to 109, defined as the regions enclosed by their respective delineation regions 110 to 113, is shown without any pattern and the delineation regions 110 to 113 are depicted as closed lines. That is, the corner structures 106, 107, 108, 109 in FIG. 1 are defined by a non-patterned portion of the material layer 101 within the delineation regions 110, 111, 112, 113, respectively. The delineation regions 110, 111, 112, 113, in turn, may be formed as feature lines etched into the material layer 101. However, in many cases the inner region of the corner structures 106 to 109 may bear a well-defined pattern formed in and/or on the material layer 101 in conformity with process sequences used for generating actual device features. These well-defined features may include additional information and/or may be used for metrology processes, as will be explained later.

The delineation regions 110 to 113, and thus the respective corner structures 106 to 109, do not show any point symmetry or axial symmetry when considered as individual elements, but exhibit axial symmetry with respect to the horizontal and vertical direction indicated by the edges of the exposure fields 101 to 105. Thus, each of the corner structures 106 to 109 clearly indicates the type of corner portion of the respective exposure fields 101 to 105. That is, the corner structure 106 clearly and unambiguously indicates the bottom right corner portion of the exposure field 101, and the corner structure 107 indicates the bottom left corner portion of the exposure field 103. Similarly, the corner structure 109 indicates the upper right corner of the exposure field 105, and the corner structure 108 indicates the upper left corner of the exposure field 104. In the present embodiment, a typical distance between the exposure field edge 134 and a corresponding corner structure is in the range of approximately 3–10 $\mu$m, and, in one embodiment, in the range from approximately 6–8 $\mu$m.

FIGS. 2a and 2b show an enlarged view of a portion of the delineation region 112 depicted in FIG. 1. In FIG. 2a, the shape of the corner structure 108 is defined by the delineation region 112, which in the present example comprises a trench 160 formed in the material layer 101. In this illustrative example, the distance 150 from the outer edge 133 of the delineation region 112 to the exposure field edge 134 is about 1 $\mu$m, the lateral extension 151 of the trench 160 is about 3 $\mu$m followed by an unpatterned region with a lateral extension 152 of about 1 $\mu$m. The lateral extension 152 defines a boundary between the delineation region 112 and a possible pattern that may be formed in the corner structure 108, as will be explained later. It should be noted, however, that the present invention is not limited to the above-specified dimensions. For example, the overall distance from the exposure field edge 134 to the inner region of the corner structure 108, i.e., the sum of the distances 150, 151 and 152, may be in the range from 3–10 $\mu$m, wherein the lateral extension 151 of the trench representing the delineation region 112 may vary from about 2–8 $\mu$m. In one embodiment, the dimensions are selected so that the resulting pattern yields a strong contrast and is clearly recognizable when subjected to an alignment procedure of a corresponding metrology tool, such as a defect inspection tool. The elongated patterns forming the delineation region 112 represent a typical feature as it is generated in the residual die region so that any process variation for forming circuit features is also detectable in the feature of the delineation regions 112.

FIG. 2b shows another example of the corner structure 108 and the delineation region 112. In this example, the delineation region 112 comprises feature lines 162. In one embodiment, these lines are produced according to a process for fabricating local interconnect lines. In conformity with the corresponding fabrication process, contact patterns (not shown) may additionally be formed over the feature lines 162. In this illustrative embodiment, the dimensions of the corner structure 108 including the delineation region 112 are as follows: the distance 155 between the delineation region 112 and the exposure field edge 134 is about 2.2 $\mu$m, the lateral extension 156 of the delineation region 112, i.e., lateral extension 156 of one space and two feature lines 162, is about 1.8 $\mu$m, and the lateral extension 157 of the region between the delineation region 112 and the inner region of the corner structure 108, i.e., the region that may comprise an additional pattern, is about 1 $\mu$m. It should be noted that a single feature line 162 or more than two feature lines 162 may be formed in the delineation region 112.

Advantageously, the feature lines 162 extend adjacent to the corner structure 108 substantially along its total length.

FIG. 3 shows the corner structure 108 and the delineation region 112 that completely encloses the corner structure 108. As can be seen from FIG. 3, the delineation region 112 defines a plurality of angles α of about 90° and angles β, γ of about 45° and 135°, respectively. In the example shown, elongated patterns 121 to 127 defining the delineation region 112 may have the following longitudinal dimensions: elongated pattern 121 about 60 μm, elongated pattern 122 about 60 μm, elongated pattern 123 about 30 μm, elongated pattern 124 about 15 μm, elongated pattern 125 about 20 μm, elongated pattern 126 about 30 μm, and elongated pattern 127 about 35.7 μm. These dimensions are merely examples and may be correspondingly varied according to specific design requirements so long as the combined elongated patterns 121 to 127 define an inner region of the corner structure 108 without point symmetry and axial symmetry. For instance, in FIG. 3, the vertical elongated patterns 122 and 112 may be extended or shortened in accordance with design requirements. The same applies for the horizontal elongated patterns 121 and 123. The terms "horizontal" and "vertical" only refer to orientations depicted in FIGS. 1–3 and are not to be considered in an absolute meaning. The corner structure 108 may, therefore, be rotated by, for example, 90°, 180° or 270° and will still provide the advantages of the present invention.

As previously mentioned, in one embodiment, the corner structure 108 is filled with a pattern that is visible using metrology and defect tools and is one that does not cause any design rule violations. One illustrative pattern for filling the corner structure 108 is a pattern of dense lines and spaces, wherein the orientation and/or pattern of the lines indicate the corresponding process level of the wafer. For example, the corner structure 108 may be filled with a structure 131 depicted in FIG. 3 indicating, for instance, the layers STI (shallow trench isolation), M1, M3, M5 (metallization layer 1, etc.), or, alternatively, the corner structure 108 may be filled with a pattern 132 indicating, for instance, the polysilicon layer, or the layers M2, M4, M6. In the case of metallization layers, vias should be generated below the line patterns 131 and 132 to resemble the structures used in the circuit patterns. Thus, the patterns 131 and 132 filling the inner region of the corner structure 108 are detectable using metrology/defect tools and the required information on process quality with respect to the process level represented by the corner structure can be obtained. Moreover, the line patterns 131 and 132 may be prepared to clearly identify a respective wafer layer or level. For instance, certain lines may be omitted to unambiguously indicate the layer under consideration. Thus, the patterns 131 and 132 may represent a type of identification "bar code" unambiguously indicating some or all of the wafer layers or levels throughout the various manufacturing stages. Preferably, the orientations of the line patterns 131 and 132 coincide with one of the linear movement directions of an exposure source used during the photolithographic patterning of the layer of material 101. In this case, it is ensured that any positional errors or deficiencies in the photolithographic process will also occur in the line pattern 131 and 132 filling the corner structure 108.

As a result, the present invention provides a semiconductor device structure comprising a corner structure defined by a delineation region that is adaptable for use with a variety of metrology apparatus, including an automatic alignment system. Furthermore, the corner structure according to the present invention exhibits a strong contrast even if the wafer is subjected to a chemical mechanical polishing process (CMP) which will lead to a significant reduction of the corner structure. The inner region of the corner structure is filled with a pattern that does not violate any design rules, and that may conveniently be used to monitor quality standards of the fabrication processes. At the same time, the pattern filling the inner region of the corner structure may bear information indicating some or all of the process layers of the wafer. Furthermore, the shape of the corner defined by elongated patterns of the delineation region are unambiguously identifiable and may not be confused with circuit patterns, wherein the type of corner portion of an exposure field is determined by the shape of the corner structure due to the missing point and axial symmetry. Preferably, two adjacent corner structures in two adjacent exposure fields separated by the respective edges of the exposure fields exhibit an axial symmetry with respect to the center line of the respective edges. Thus, at a location where four exposure fields meet, the individual corners of the exposure fields can be identified.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a die region defined by an exposure field of a lithography apparatus for fabricating the semiconductor device, the die region comprising a material layer and a corner structure formed in said material layer and located at the corner of the die region in spaced relationship to an edge of the die region; and
   a delineation region at least partially enclosing said corner structure, said delineation region comprising a plurality of elongated patterns formed in said material layer, wherein the delineation region is asymmetric with respect to point symmetry and axial symmetry and defines an inner region of the corner structure, and wherein the delineation region comprises a plurality of angles of approximately 90° defined by at least some of the elongated patterns.

2. The semiconductor device structure of claim 1, wherein at least two of the elongated patterns form an angle other than 90°.

3. The semiconductor device structure of claim 1, wherein each of the plurality of elongated patterns comprises a plurality of individual features.

4. The semiconductor device structure of claim 1, wherein a length of a first elongated pattern and a length of a second elongated pattern exceed the length of the remaining elongated patterns, respectively, whereby the first and second elongated patterns form an angle of approximately 90°.

5. The semiconductor device of claim 4, wherein the first and second elongated patterns are located adjacent to and substantially parallel with corresponding edges of the exposure field, whereby a distance of the first and second elongated patterns from the corresponding edges of the exposure field is in the range from about 2 μm to about 10 μm.

6. The semiconductor device structure of claim 1, wherein a lateral dimension of the elongated patterns is in the range from about 1 μm to about 5 μm.

7. The semiconductor device structure of claim 1, wherein the inner region is filled with a predefined identification pattern.

8. The semiconductor device structure of claim 7, wherein the predefined identification pattern is indicative for the material layer in which the corner structure is formed.

9. The semiconductor device structure of claim 7, wherein the predefined identification pattern is usable for metrology apparatus to align the substrate for an automated inspection process.

10. The semiconductor device structure of claim 7, wherein the predefined identification pattern comprises a plurality of parallel lines.

11. The semiconductor device structure of claim 1, wherein the delineation region further comprises an angle of about 45° and an angle of about 135° defined by at least some of the elongated patterns.

12. The semiconductor device structure of claim 11, wherein the length of at least first and second elongated patterns are in the range of approximately 40 $\mu$m to approximately 80 $\mu$m.

13. The semiconductor device structure of claim 1, wherein a minimal extension of the inner region is in the range of approximately 5 $\mu$m to approximately 25 $\mu$m.

14. The semiconductor device structure of claim 1, wherein the predefined identification pattern comprises a plurality of vias formed in the material layer.

15. The semiconductor device structure of claim 14, wherein said material layer is a layer on which a metallization layer is to be formed.

16. The semiconductor device structure of claim 1, wherein the delineation region comprises at least one feature used in semiconductor manufacturing from the group consisting of a shallow trench, a local interconnect line and a contact pattern.

17. The semiconductor device structure of claim 1, further comprising a second die region comprising a second corner structure with a second delineation region, wherein the corner structure and the second corner structure are axial symmetric with respect to a center line separating the die region and the second die region.

18. A semiconductor device, comprising:
    a die region defined by an exposure field of a lithography apparatus for fabricating the semiconductor device, the die region comprising a material layer and a corner structure formed in said material layer and located at the corner of the die region in spaced relationship to an edge of the die region; and
    a delineation region at least partially enclosing said corner structure, said delineation region comprising a plurality of elongated patterns formed in said material layer, wherein the delineation region is asymmetric with respect to point symmetry and axial symmetry and defines an inner region of the corner structure, and wherein the delineation region comprises a plurality of angles of approximately 90° defined by at least some of the elongated patterns, wherein said inner region is filled with a predefined identification pattern comprised of a plurality of parallel lines, wherein the orientations of the parallel lines of the predefined identification patterns of corner structures formed in two subsequent material layers differ from each other.

* * * * *